(12) United States Patent
Chen et al.

(10) Patent No.: US 7,087,134 B2
(45) Date of Patent: Aug. 8, 2006

(54) SYSTEM AND METHOD FOR DIRECT-BONDING OF SUBSTRATES

(75) Inventors: Chien-Hua Chen, Corvallis, OR (US); Charles C. Haluzak, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 46 days.

(21) Appl. No.: 10/816,509

(22) Filed: Mar. 31, 2004

(65) Prior Publication Data

US 2005/0224155 A1 Oct. 13, 2005

(51) Int. Cl.
*B32B 37/00* (2006.01)

(52) U.S. Cl. ........................ 156/281; 438/455

(58) Field of Classification Search ............... 156/73.1, 156/281, 290, 292, 308.2, 580.1, 580.2, 583.1, 156/228; 438/455
See application file for complete search history.

(56) References Cited

U.S. PATENT DOCUMENTS

| | | | |
|---|---|---|---|
| 5,421,953 A | 6/1995 | Nagakubo et al. | |
| 5,427,638 A | 6/1995 | Goetz et al. | |
| 5,503,704 A | 4/1996 | Bower et al. | |
| 6,093,577 A | 7/2000 | van der Groen et al. | |
| 6,180,496 B1 | 1/2001 | Farrens et al. | |
| 6,316,322 B1 | 11/2001 | Hao | |
| 6,316,332 B1 | 11/2001 | Lo et al. | |
| 6,455,398 B1 | 9/2002 | Fonstad, Jr. et al. | |
| 6,469,909 B1 | 10/2002 | Simmons | |
| 6,553,651 B1 * | 4/2003 | Reznik et al. | 29/608 |
| 6,555,904 B1 | 4/2003 | Karpman | |
| 6,559,530 B1 | 5/2003 | Hinzel et al. | |
| 6,617,040 B1 * | 9/2003 | Houser et al. | 428/447 |
| 6,660,614 B1 | 12/2003 | Hirschfeld et al. | |
| 6,780,759 B1 | 8/2004 | Farrens et al. | |
| 6,902,987 B1 | 6/2005 | Tong et al. | |
| 2004/0058476 A1 | 3/2004 | Enquist et al. | |

OTHER PUBLICATIONS

Hiller, et al., Subproject C4: "Microelectronic compatible scanner arrays of high frequency," pp. 37-39. www.infotech.tu-chemnitz.de/ microtec/eng/press/annualrep02/pdf/subproject_c4.pdf.
Martin A Schmidt, "Wafer-to-Wafer Bonding for Microstructure Formation", Proc. of the IEEE, V. 86 (8), Aug. 1998, pp. 1575-1585.
T. Suni et al, "Effects of Plasma Activation on Hydrophilic Bonding of Si and SiO2", Jrnl of the Electrochemical Society, V 149(6), pp. G348-G351.
Q.Y. Tong et al, "Feasibility Study of VLSI Device Layer Transfer by CMP PETEOS Direct Bonding", Proc. of the 1996 IEEE Int'l SOI Conference, Oct. 1996.

* cited by examiner

*Primary Examiner*—James Sells

(57) ABSTRACT

A method of bonding substrates and devices having bonded substrates are disclosed. The method of bonding substrates includes depositing a layer of bonding substrate material onto a bonding surface of a first substrate. A bonding site density of at least one of the layer of bonding substrate material or a bonding surface of a second substrate is increased, and the bonding surface of the first substrate having the layer of bonding substrate material is bonded to the bonding surface of the second substrate.

8 Claims, 4 Drawing Sheets

SYSTEM AND METHOD FOR DIRECT-BONDING OF SUBSTRATES

BACKGROUND OF THE INVENTION

The present invention relates generally to the field of bonding of substrates. In particular, the invention relates to methods of bonding substrates in MEMS and other devices to reduce the reflection loss of light.

MEMS and other devices often include two or more substrates either in close proximity or bonded together. For example, in optical systems such as digital projectors, a device may include an interference-based digital light display (DLD) package which includes two or more substrates to direct light to and from the DLD. Similar to a CRT in a rear-projection television, a DLD can be used in digital projectors for processing or generating an image from a source light.

One such DLD package is illustrated in FIG. 1. The package 100 includes a base substrate 120 with a driving electrode 122, a pixel plate 110 which can move vertically, and a thin protective substrate or membrane 130. A reflective coating may be provided on the pixel plate 110, and a partial reflective coating may be provided on the bottom surface of the membrane 130. The protective membrane 130 encloses a cavity in which the DLD pixel plate 110 is enclosed and allows some light to pass therethrough. In some cases, such as in the case of the package 100 illustrated in FIG. 1, a second substrate 140, which may be made of thick glass, is provided in close proximity to the protective membrane 130 for processing the light, for example. The protective membrane 130 and the second substrate 140 are separated by a bond ring 150 positioned at the perimeter of the protective membrane 130 and the second substrate 140. Thus, light 160 from a source (not shown) can pass through the second substrate 140 and the protective membrane 130 to reach the pixel plate 110. By moving the pixel plate vertically, different light colors are generated as a result of light interference. As the gap between the pixel plate 110 and the protective membrane 130 changes, the processed light 170 (image) goes through the second substrate 140 to additional light processing components such as lenses, for example.

As the light 160, 170 passes through the protective membrane 130 and the second substrate 140, it passes through regions of differing refractive indices (RI's). For example, the protective membrane 130 and the second substrate 140 may each have a different RI, while the space between the protective membrane 130 and the second substrate 140 may have a third different RI. This change in RI along the path of the light causes a portion of the light 160, 170 to be lost as reflected light 180, thereby reducing the quality of the image generated by the DLD package 100. To counter the reflection, the various surfaces of the protective membrane 130 and the second substrate 140 may be provided with anti-reflective coating. Such coating can be expensive and difficult to implement, particularly for certain internal surfaces. Further, the package may not be hermetically sealed, as moisture or gas molecules may penetrate the bond ring 150.

SUMMARY OF THE INVENTION

One embodiment of the invention relates to a method of bonding substrates. The method includes depositing a layer of bonding substrate material onto a bonding surface of a first substrate. A bonding site density of at least one of the layer of bonding substrate material on the first substrate and a bonding surface of a second substrate is increased, and the bonding surface of the first substrate having the layer of bonding substrate material is bonded to the bonding surface of the second substrate.

Another embodiment of the invention relates to a MEMS package. The package includes a first substrate having a bonding surface, a second substrate having a polished bonding surface facing the bonding surface of the first substrate, and a polished layer of bonding substrate material deposited onto the bonding surface of the first substrate and fusion bonded to the polished bonding surface of the second substrate.

It is to be understood that both the foregoing general description and the following detailed description are exemplary and exemplary only, and are not restrictive of the invention as claimed.

DETAILED DESCRIPTION OF CERTAIN EMBODIMENTS

Figure 1:
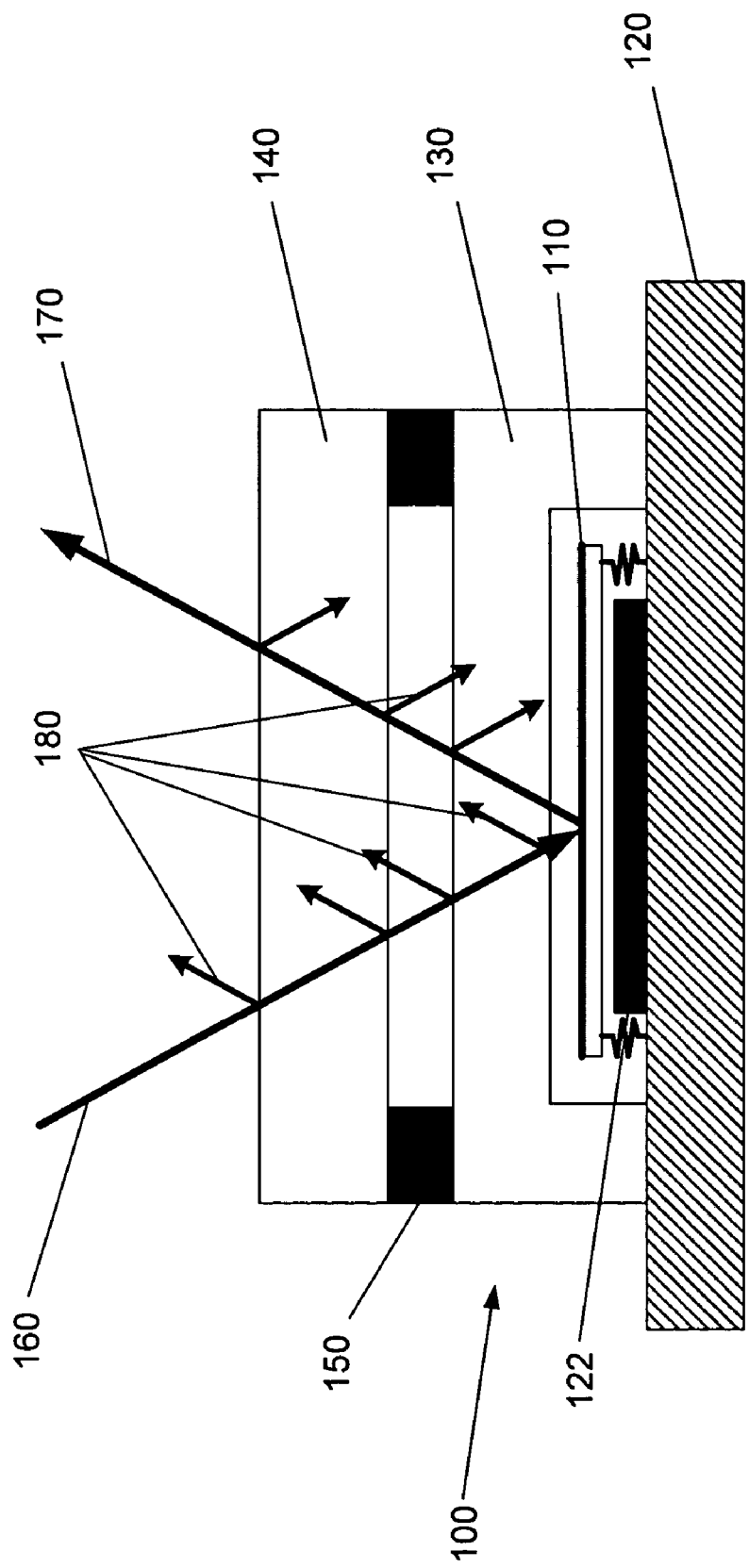
FIG. 1 is a cross-sectional view of a prior art MEMS device.
Figure 2:
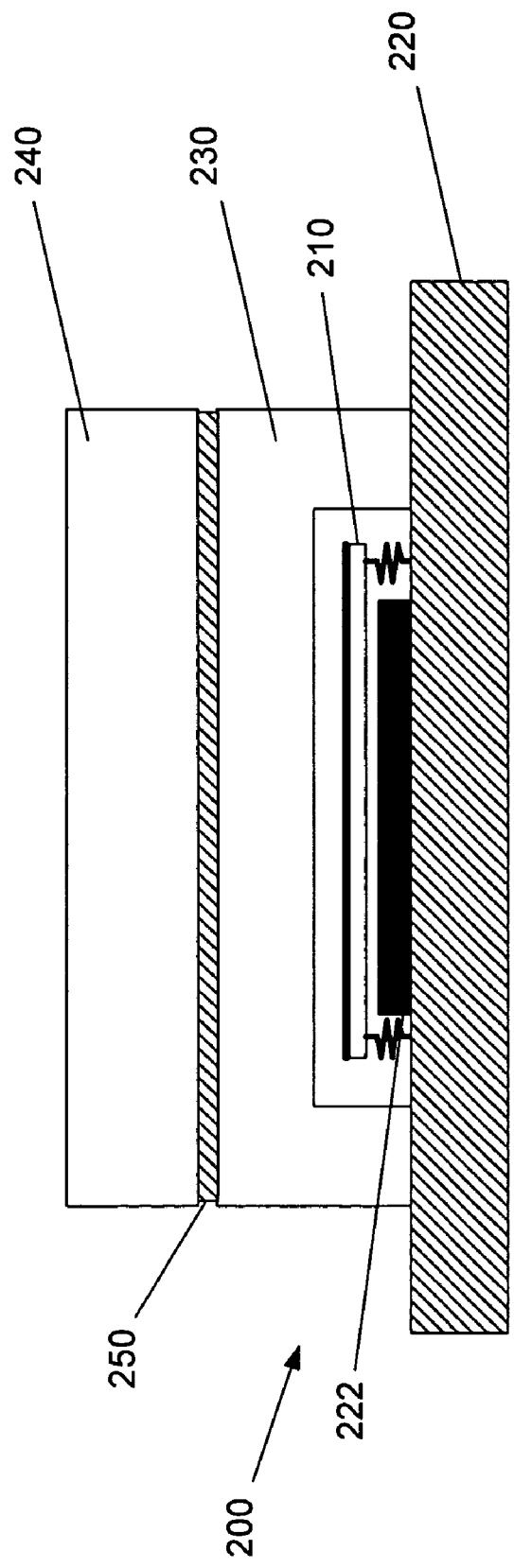
FIG. 2 is a cross-sectional view of a MEMS device according to an embodiment of the invention.

Referring to FIG. 2, a cross-sectional view of a package according to an embodiment of the invention is illustrated. In one embodiment, the package 200 includes an image processing device for use in a digital projector. The package 200 includes an exemplary digital light display (DLD) device with a pixel plate 210 mounted on a support base 220 with a driving electrode 222. Of course, other optical devices may be used, such as a liquid crystal display (LCD) or liquid crystal on silicon (LCOS), for example. Such optical devices are well known to those skilled in the art and do not require further discussion for purposes of this application. While the package 200 in the illustrated embodiment is an optical device, it will be understood by those skilled in the art that the invention is not limited to optical devices and may include other devices having two or more substrates.

The support base 220 may be made of a variety of materials, such as a semiconductor or a non-conductive substrate, and may have a thickness selected to provide sufficient strength to support the DLD pixel plate 210. The material and thickness of the support base 220 is not limiting on the invention.

The pixel plate 210 is encased by a protective membrane 230 mounted on the support base 220. The substrate 230 can be made of a variety of materials. In one embodiment, the protective membrane 230 is made of tetraethoxysilane (TEOS). The protective membrane 230 may have a partial reflective coating on its bottom surface and can allow portion of an incoming light to pass therethrough. The light is reflected back from the pixel plate 210 to generate the desirable interference color effect based on the gap between the pixel plate 210 and the protective membrane 230. The protective membrane 230 may have a known refractive index (RI). In the case of TEOS, the protective membrane 230 has an RI of approximately 1.5. In one embodiment, the protective membrane 230 has a thickness of between 0.5 and 2.0 microns at least in the region above the pixel plate 210.

A lid 240 is positioned above the protective membrane 230. For an optical device, the lid 240 is adapted to allow light to pass therethrough. In a particular embodiment, the lid 240 is made of a substrate material, such as glass, and has a thickness of between 0.5 and 3 mm. The thickness of the lid 240 may be selected according to various system requirements, such as gas permeability, for example. The lid 240 may have an RI that is similar or different from the RI of the substrate 230. In one embodiment, the lid 240 is formed of glass and has an RI of approximately 1.5, similar to the RI of the protective membrane 230.

The lid 240 and the protective membrane 230 are bonded together with a thin layer 250 of a bonding substrate material therebetween. The layer of bonding substrate material 250 is positioned between the protective membrane 230 and the lid 240 and has a thickness on the order of a few microns. In a particular embodiment, the layer 250 is formed of a material having an RI that is similar to the RI at least one of the protective membrane 230 and the lid 240. The bonding substrate material may include any or a variety of materials. For example, the bonding substrate material may be a semiconductor, a dielectric or an insulator material. The bonding substrate material may be formed of polysilicone, TEOS, silicon nitride, or glass frit material, for example. In one embodiment, the bonding substrate material is formed of TEOS that has been deposited onto a bonding surface of the lid 240, as described below with reference to FIGS. 3 and 4.

In this arrangement, the need for an anti-reflective (AR) coating is eliminated on the bonding surfaces of the lid 240 and the protective membrane 230. Since the RI of each of the protective membrane 230, lid 240 and the layer 250 may be selected to be similar to each other, the undesired reflection of light from the bonding surfaces is eliminated or substantially reduced. Thus, in one embodiment, the protective membrane 230 and the layer 250 may be formed of TEOS, and the lid 240 may be formed of glass, each having an RI of approximately 1.5.

Figure 3:
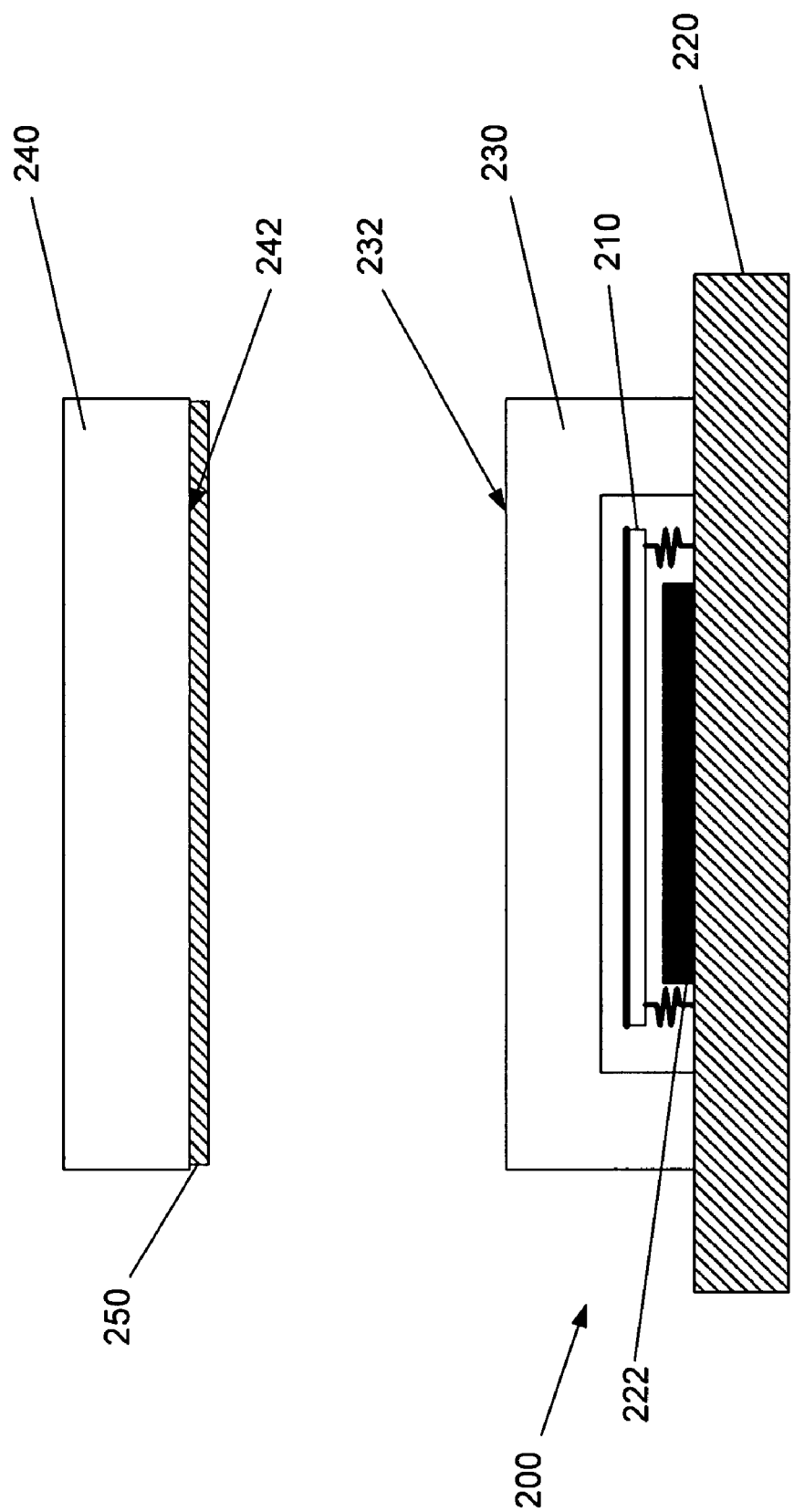
FIG. 3 is a cross-sectional view of the MEMS device of FIG. 2 prior to bonding of the substrates.
Figure 4:
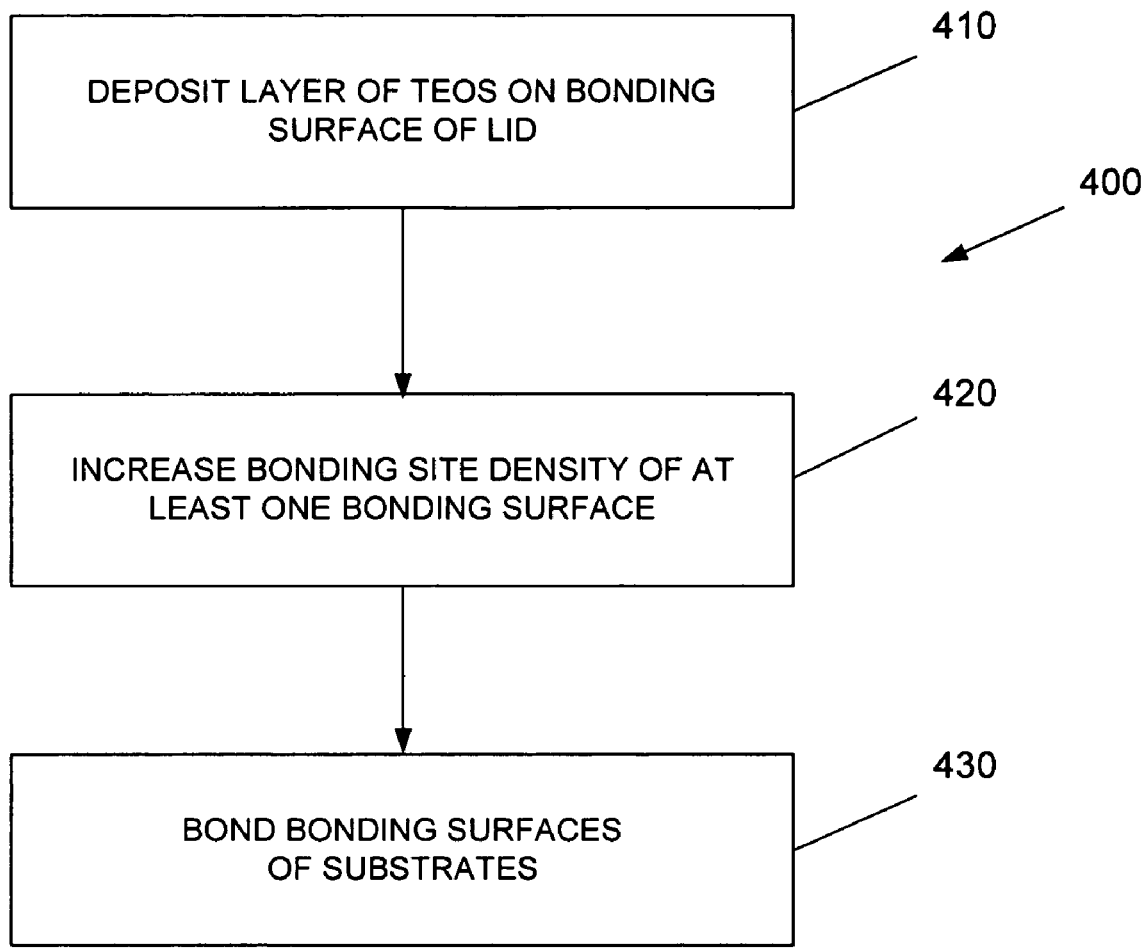
FIG. 4 is a flow chart illustrating a method of bonding substrates according to an embodiment of the invention.

An embodiment of a process of forming the package of FIG. 2 will now be described with reference to FIGS. 3 and 4. The method 400 includes depositing a layer of bonding substrate material 250, such as TEOS, amorphous silicon, phosphosilicate glass (PSG), glass frit, or silicon nitride to a bonding surface 242 of the lid 240, which may be formed of glass (block 410). The bonding substrate material 250 may be deposited through a variety of methods such as sputtering, chemical vapor deposition (CVD), or screen print, for example. The layer of bonding substrate material 250 is a relatively thin layer having a thickness on the order of between tens of an angstrom and tenths of a micron. In one embodiment, an AR coating is applied to the opposite surface of the lid 240.

The bonding surfaces may be polished for smoothness. In this regard, the bonding surface 232 of the protective membrane 230 and the layer of bonding substrate material 250 on the bonding surface 242 of the lid 240 may be polished to Angstrom-level flatness via chemical-mechanical polishing (CMP), for example.

At block 420, the bonding site (silanol group) density of at least one of the bonding surfaces is increased to provide a more secure bonding of the substrates. The bonding site density may be increased through, for example, plasma treatment and an optional wet treatment with either de-ionized water or SC1 (Standard Clean 1) chemistry. In this regard, the bond density of the bonding surface 232 of the protective membrane 230 or the layer of bonding substrate material 250 on the bonding surface 242 of the lid 240 may be increased through any of a variety of methods including plasma treatment, ion implant and physical sputtering. In a particular embodiment, the bonding site density is increased for both surfaces. The increase in bonding site density effectively increases the bond strength of the samples.

In one embodiment, the bonding site density is increased by plasma treating the bonding surfaces. This may be accomplished through, for example, an ion beam sputtering process, a reactive ion etcher, striking plasma onto the bonding surface, ion implantation or ion bombardment. The plasma treatment may use $O_2$, $N_2$ or Ar plasma, for example.

Following the plasma treatment, the bonding surfaces may be dipped in de-ionized water or SC1 chemistry for a period of time. In this regard, a minute or less is generally sufficient to increase the silanol group (Si—OH) density of the surfaces. For example, dipping for five minutes may be sufficient. The surfaces may then be dried using, for example, a spin-rinse drier. Other methods of increasing bonding site density are well known to those skilled in the art and are contemplated within the scope of the invention.

At block 430, the bonding surfaces are fusion bonded at room temperature. The fusion bonding may be accomplished by holding the bonding surfaces together while applying a compression force. The increased bonding site density allows the fusion bonding to be performed at substantially room temperature, rather than typical fusion bonding processes which may require annealing temperatures as high as 900° C. "Room temperature," as used herein, includes temperatures ranging between approximately 15 and approximately 40° C.

In one embodiment, the package 200 is annealed. In one embodiment, the lid 240 formed of glass with a thin layer 250 of TEOS is bonded to a protective membrane 230 formed of TEOS, and the package 200 is annealed at approximately 200° C. for approximately two hours.

Thus, the protective membrane 230 and the lid 240 are bonded to each other with no need for AR coating on the bonding surfaces 232, 242. The increasing of the silanol-group density through plasma treatment and post-bond annealing provide a bond of sufficient strength to secure the protective membrane 230 and the lid 240 to each other. Further, the package 200 may be made hermetically sealed by assuring that the lid 240 is sufficiently thick to prevent moisture or gas molecules to penetrate therethrough. In this regard, a lid 240 formed of glass and having a thickness between 0.5 and 3 mm is sufficient.

The foregoing description of embodiments of the invention have been presented for purposes of illustration and description. It is not intended to be exhaustive or to limit the invention to the precise form disclosed, and modifications and variation are possible in light of the above teachings or may be acquired from practice of the invention. The embodiment was chosen and described in order to explain the principles of the invention and its practical application to enable one skilled in the art to utilize the invention in various embodiments and with various modification as are suited to the particular use contemplated. It is intended that the scope of the invention be defined by the claims appended hereto and their equivalents.

What is claimed is:

1. A method of bonding substrates, comprising:
    depositing a layer of bonding substrate material of TEOS oxide onto a bonding surface of a first substrate of glass;
    increasing a bonding site density by striking plasma onto the bonding surface treatment without a wet treatment thereafter on the layer of bonding substrate material on said first substrate and on a bonding surface of a second substrate that includes TEOS oxide enclosing an optical device; and
    fusion bonding at room temperature using compression force the bonding surface of the first substrate having the layer of bonding substrate material to the bonding surface of the second substrate.

2. A method according to claim 1, further comprising:
    polishing the layer of bonding substrate material and the bonding surface of the second substrate prior to the step of increasing the bonding site density.

3. A method according to claim 2, wherein the step of polishing includes using chemical-mechanical polishing.

4. The method according to claim 2, wherein said step of polishing includes polishing said layer and said second substrate to angstrom-level flatness.

5. A method according to claim 1, wherein the step of increasing the bonding site density comprises:
    plasma striking the bonding surfaces of the first substrate and the second substrate with at least one of the group of $O_2$, $N_2$, and Ar plasma.

6. A method according to claim 5, wherein the step of bonding further comprises:
    annealing the package for approximately two hours at approximately 200° C.

7. The method according to claim 1, wherein the refractive index of the layer of bonding substrate material is similar to at least one of the first substrate or the second substrate.

8. A method according to claim 1, wherein the step of increasing the bonding site density comprises:
    plasma striking at least one of the layer of bonding substrate material and the bonding surface of the second substrate with at least one of the group of an ion beam sputtering process, ion implantation, and ion bombardment.

* * * * *